United States Patent
Ma et al.

(10) Patent No.: US 11,984,487 B2
(45) Date of Patent: May 14, 2024

(54) NON-PLANAR TRANSISTOR ARRANGEMENTS WITH ASYMMETRIC GATE ENCLOSURES

(71) Applicant: Intel Corporation, Santa Clara, CA (US)

(72) Inventors: Sean T. Ma, Portland, OR (US); Guillaume Bouche, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 780 days.

(21) Appl. No.: 16/892,447

(22) Filed: Jun. 4, 2020

(65) Prior Publication Data

US 2021/0384299 A1 Dec. 9, 2021

(51) Int. Cl.
*H01L 29/423* (2006.01)
*H01L 21/8234* (2006.01)
*H01L 27/088* (2006.01)
*H01L 27/092* (2006.01)
*H01L 29/06* (2006.01)
*H01L 29/10* (2006.01)
(Continued)

(52) U.S. Cl.
CPC .. *H01L 29/4238* (2013.01); *H01L 21/823431* (2013.01); *H01L 27/0886* (2013.01); *H01L 27/092* (2013.01); *H01L 29/0665* (2013.01); *H01L 29/0673* (2013.01); *H01L 29/1037* (2013.01); *H01L 29/42376* (2013.01); *H01L 29/42392* (2013.01); *H01L 29/516* (2013.01); *H01L 29/66439* (2013.01); *H01L 29/66469* (2013.01); *H01L 29/775* (2013.01); *H01L 29/785* (2013.01); *H01L 29/78696* (2013.01); *B82Y 10/00* (2013.01)

(58) Field of Classification Search
CPC ......... H01L 29/4238; H01L 21/823431; H01L 27/0886; H01L 27/092; H01L 29/0665; H01L 29/0673; H01L 29/1037; H01L 29/42376; H01L 29/42392; H01L 29/516; H01L 29/785; H01L 29/78696; B82Y 10/00
See application file for complete search history.

(56) References Cited

U.S. PATENT DOCUMENTS

| | | | |
|---|---|---|---|
| 2013/0037888 A1* | 2/2013 | Han | H01L 29/78 257/E27.06 |
| 2014/0117460 A1* | 5/2014 | Han | H01L 29/78 257/401 |

(Continued)

*Primary Examiner* — William F Kraig
(74) *Attorney, Agent, or Firm* — Akona IP PC

(57) ABSTRACT

Disclosed herein are non-planar transistor (e.g., nanoribbon) arrangements having asymmetric gate enclosures on at least one side. An example transistor arrangement includes a channel material shaped as a nanoribbon, and a gate stack wrapping around at least a portion of a first face of the nanoribbon, a sidewall, and a portion of a second face of the nanoribbon. Portions of the gate stack provided over the first and second faces of the nanoribbon extend in a direction parallel to the longitudinal axis of the nanoribbon for a certain distance that may be referred to as a "gate length." A portion of the gate stack wrapping around the sidewall of the nanoribbon does not extend along the entire gate length, but, rather, extends over less than a half of the gate length, e.g., about one third of the gate length, thus making the gate enclosure on that sidewall asymmetric.

20 Claims, 9 Drawing Sheets

(51) Int. Cl.
*H01L 29/51* (2006.01)
*H01L 29/66* (2006.01)
*H01L 29/775* (2006.01)
*H01L 29/78* (2006.01)
*H01L 29/786* (2006.01)
*B82Y 10/00* (2011.01)

(56) References Cited

U.S. PATENT DOCUMENTS

2018/0350932 A1* 12/2018 Liu .................. H01L 21/32133
2019/0140096 A1*  5/2019 Huang ................... H01L 29/78
2020/0176613 A1*  6/2020 Barraud ............ H01L 29/78696
2021/0359103 A1* 11/2021 Xie .................. H01L 29/42376
2021/0375926 A1* 12/2021 Mehandru ......... H01L 29/78696

* cited by examiner

US 11,984,487 B2

NON-PLANAR TRANSISTOR ARRANGEMENTS WITH ASYMMETRIC GATE ENCLOSURES

TECHNICAL FIELD

This disclosure relates generally to the field of semiconductor devices, and more specifically, to non-planar transistors such as nanoribbon transistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
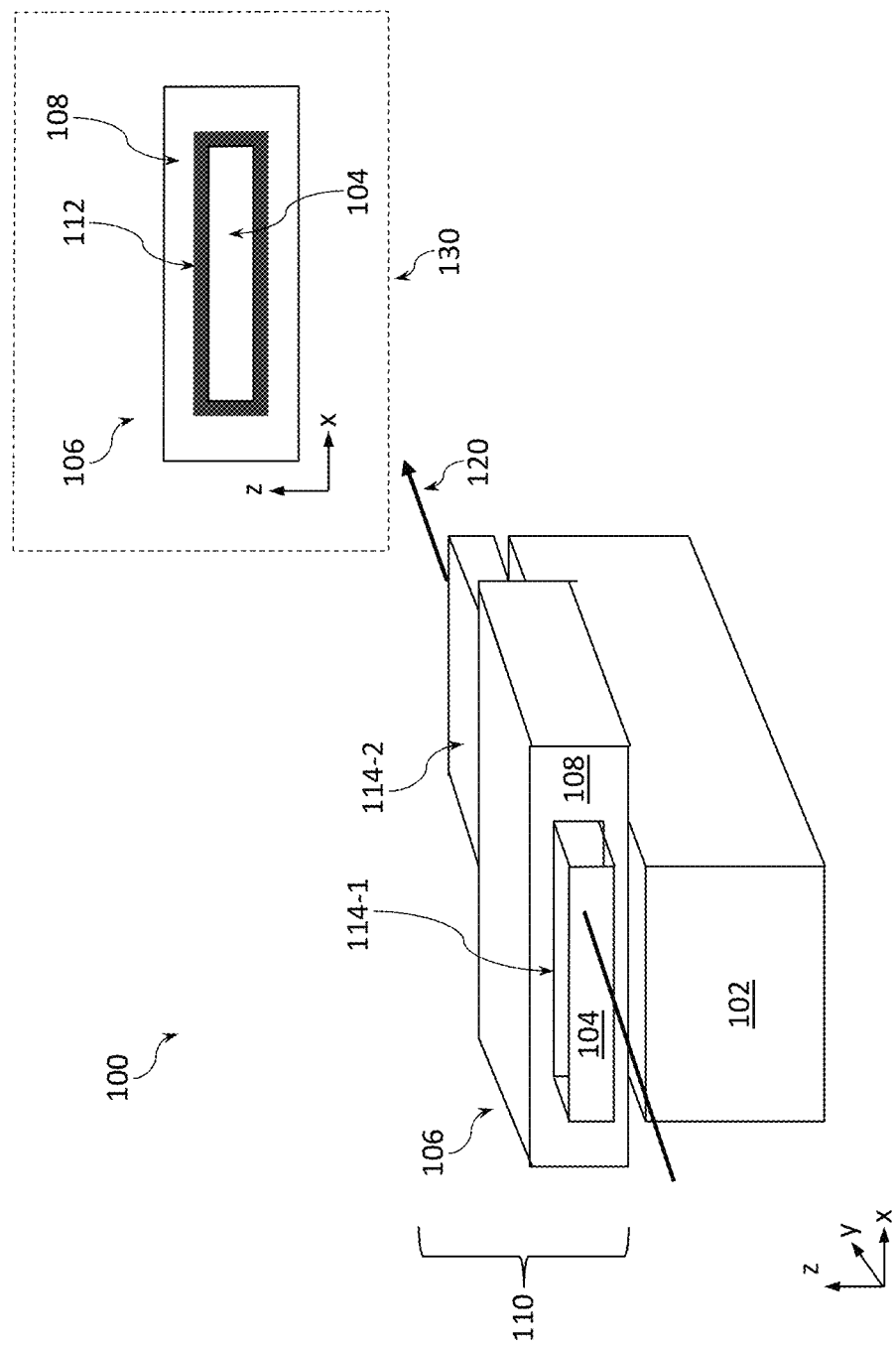
FIG. 1 provides a perspective view of an example nanoribbon-based field-effect transistor (FET), in accordance with various embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating non-planar transistor arrangements with asymmetric gate enclosures, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

Non-planar transistors such as double-gate transistors, trigate transistors, FinFETs, nanowire, and nanoribbon transistors refer to transistors having a non-planar architecture. In comparison to a planar architecture where the transistor channel has only one confinement surface, a non-planar architecture is any type of architecture where the transistor channel has more than one confinement surfaces. A confinement surface refers to a particular orientation of the channel surface that is confined by the gate field. Non-planar transistors potentially improve performance relative to transistors having a planar architecture, such as single-gate transistors.

A gate enclosure of a transistor refers to a portion of the gate stack which sets the amount of a "top-down" space that a gate stack consumes beyond the channel confinement surface. Conventional non-planar transistor architectures all utilize gate enclosures that not only consume space but also add parasitic capacitance, impacting area scaling, speed improvements, and energy savings. A forksheet architecture has been proposed in the literature as a scaling booster to reduce the cell dimensions and parasitic capacitance, where the name "forksheet" arises because of its complex bilateral finned structure. In a forksheet transistor, there is no gate enclosure on one of the two sides of the vertical stack of lateral nanosheets or nanoribbons, while the gate enclosure on the other side still remains.

Embodiments of the present disclosure provide non-planar transistor arrangements having asymmetric gate enclosures on at least one side, e.g., nanoribbon transistor arrangements having an asymmetric gate enclosure on at least one sidewall of a nanoribbon or a stack of nanoribbons, where the asymmetry is with respect to the middle of the channel length of the transistors. As used herein, the term "nanoribbon" refers to an elongated semiconductor structure having a long axis parallel to a support structure (e.g., a substrate, a chip, or a wafer) over which a transistor arrangement is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular or square-like transverse cross-section. In the present disclosure, the term "nanoribbon" is used to describe both such nanoribbons (including nanosheets) and nanowires, as well as elongated semiconductor structures with a longitudinal axis parallel to the support structures and with having transverse cross-sections of any geometry (e.g., oval, or a polygon with rounded corners). As used herein, the term "face of a nanoribbon" refers to any of the confinement surfaces (i.e., interfaces of the semiconductor material of the nanoribbon with the gate stack) of the nanoribbon which are substantially parallel to the support structure when a nanoribbon extends in a direction parallel to the support structure, while the term "sidewall of a nanoribbon" refers to any of the confinement surfaces of the nanoribbon connecting the bottom face and the top face (the bottom face being the face of the nanoribbon that is closer to the support structure than the top face). In one aspect of the present disclosure, an example nanoribbon transistor arrangement includes a channel material shaped as a nanoribbon, and a gate stack wrapping around at least a portion of a first (e.g., bottom) face of the nanoribbon, a sidewall, and a portion of a second (e.g., top) face of the nanoribbon. Portions of the gate stack provided over the first and second faces of the nanoribbon extend in a direction parallel to the longitudinal axis of the nanoribbon for a certain distance that may be referred to as a "gate length." In contrast, a portion of the gate stack wrapping around the sidewall of the nanoribbon does not extend along the entire gate length, but, rather, forms what may be referred to as a "pillar portion" that extends over less than a half of the gate length, e.g., about one third of the gate length, thus making the gate enclosure on that sidewall asymmetric. In various embodiments, the other sidewall of the nanoribbon may have no gate enclosure at all (e.g., similar to a forksheet architecture), may have a full (e.g., conventional) gate enclosure that extends over the entire gate length, or may have an asymmetric gate enclosure as well.

While some descriptions are provided herein with reference to nanoribbon transistors, the principles of asymmetric gate enclosures described herein are equally applicable to FinFETs, where a gate stack provided over at least one sidewall of a fin may be asymmetric in that it does not extend over the entire gate length. Providing non-planar transistor arrangements with asymmetric gate enclosures may allow reducing the distance between adjacent nanoribbons, nanoribbon stacks, or fins provided next to one another in that their gate enclosures may be staggered with respect to one another without electrical shorting, which may further lead to reduced parasitic capacitances and improve energy savings and speed.

Various IC devices with one or more non-planar transistor arrangements with asymmetric gate enclosures as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 2A-2C, such a collection may be referred to herein without the letters, e.g., as "FIG. 2."

The drawings are intended to show relative arrangements of the elements therein, and the device assemblies of these figures may include other elements that are not specifically illustrated (e.g., various interfacial layers). Similarly, although particular arrangements of materials are discussed with reference to the drawings, intermediate materials may be included in the devices and assemblies of these drawings. Still further, although some elements of the various device views are illustrated in the drawings as being planar rectangles or formed of rectangular solids and although some schematic illustrations of example structures are shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more non-planar transistor arrangements with asymmetric gate enclosures as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising,"

"including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. In another example, a term "interconnect" is used to describe any element formed of an electrically conductive material for providing electrical connectivity to one or more components associated with an IC or/and between various such components. The terms "substantially," "close," "approximately," "near," and "about," generally refer to being within +/−20% of a target value based on the context of a particular value as described herein or as known in the art.

Example Nanoribbon Transistor Arrangement

FIG. 1 provides a perspective view of an example IC structure with a nanoribbon-based field-effect transistor (FET) 110 that may be adapted to form a nanoribbon transistor arrangement with an asymmetric gate enclosure, in accordance with various embodiments. For example, in various embodiments, the transistor 110 formed on the basis of a nanoribbon 104, shown in FIG. 1, may be formed on the basis of any of the nanoribbons 204 of the nanoribbon transistor arrangement 200, except that the transistors formed therein would include asymmetric gate enclosures, as described herein.

Turning to the details of FIG. 1, the arrangement 100 may include a channel material formed as a nanoribbon 104 made of one or more semiconductor materials, the nanoribbon 104 provided over a support structure 102. The transistor 110 may be formed on the basis of the nanoribbon 104 by having a gate stack 106 wrap around at least a portion of the nanoribbon referred to as a "channel portion" and by having source and drain regions, shown in FIG. 1 as a first source or drain (S/D) region 114-1 and a second S/D region 114-2 on either side of the gate stack 106. In some embodiments, a layer of oxide material (not specifically shown in FIG. 1) may be provided between the support structure 102 and the gate stack 106.

The arrangement 100 shown in FIG. 1 (and other figures of the present disclosure) is intended to show relative arrangements of some of the components therein, and the arrangement 100, or portions thereof, may include other components that are not illustrated (e.g., electrical contacts to the S/D regions 114 of the transistor 110, additional layers such as a spacer layer around the gate electrode of the transistor 110, etc.). For example, although not specifically illustrated in FIG. 1, a dielectric spacer may be provided between the source electrode and the gate stack as well as between the transistor drain electrode and the gate stack of the transistor 110 in order to provide electrical isolation between the source, gate, drain electrodes. In another example, although not specifically illustrated in FIG. 1, at least portions of the transistor 110 may be surrounded in an insulator material, such as any suitable interlayer dielectric (ILD) material (e.g., the ILD material 208, shown in FIG. 2). In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Figure 4:
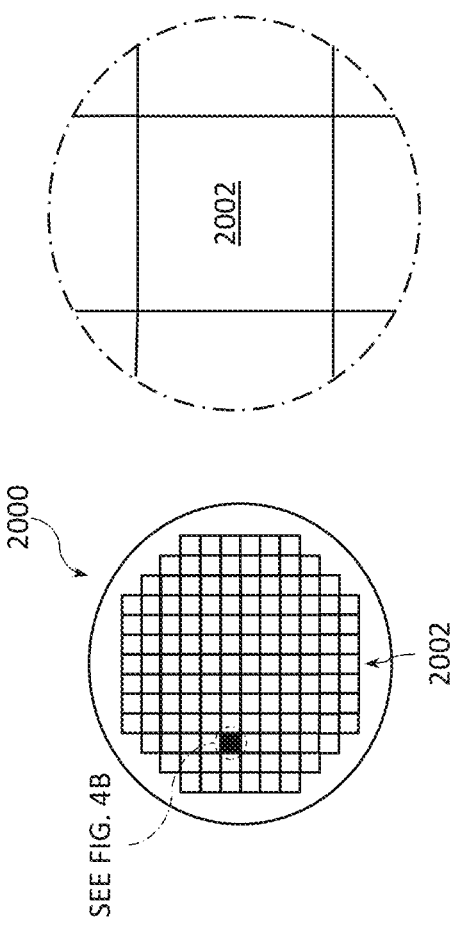
FIGS. 4A and 4B are top views of, respectively, a wafer and dies that may include one or more non-planar transistor arrangements with asymmetric gate enclosures, in accordance with various embodiments.

Implementations of the present disclosure may be formed or carried out on any suitable support structure 102, such as a substrate, a die, a wafer, or a chip. The support structure 102 may, e.g., be the wafer 2000 of FIG. 4A, discussed below, and may be, or be included in, a die, e.g., the singulated die 2002 of FIG. 4B, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which a semiconductor device implementing any of the non-planar transistor arrangements with asymmetric gate enclosures as described herein may be built falls within the spirit and scope of the present disclosure.

Figure 2A:
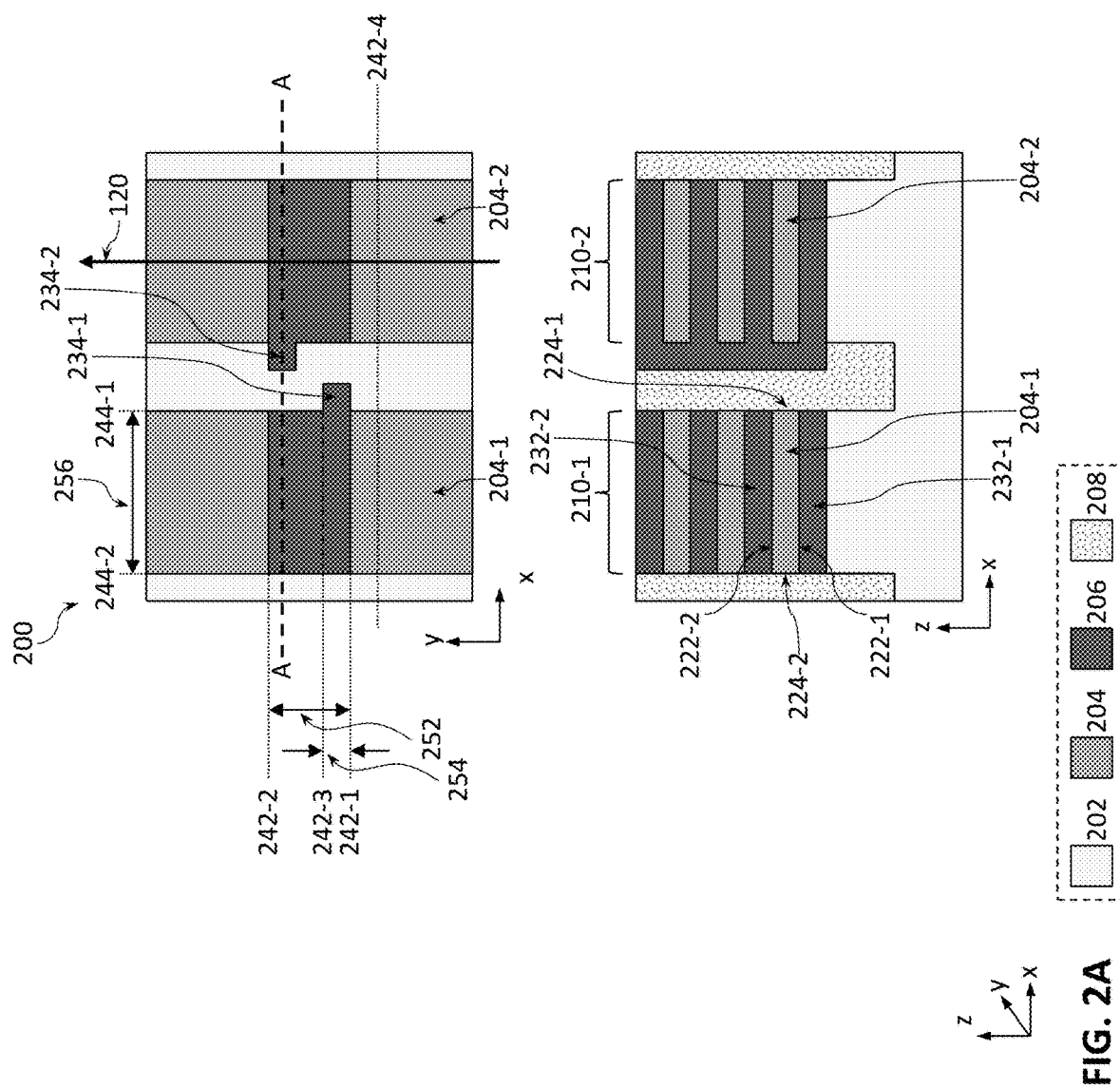
FIGS. 2A-2C provide top-down and cross-sectional side views of an example nanoribbon transistor arrangement with asymmetric gate enclosures, in accordance with various embodiments.
Figure 2B:
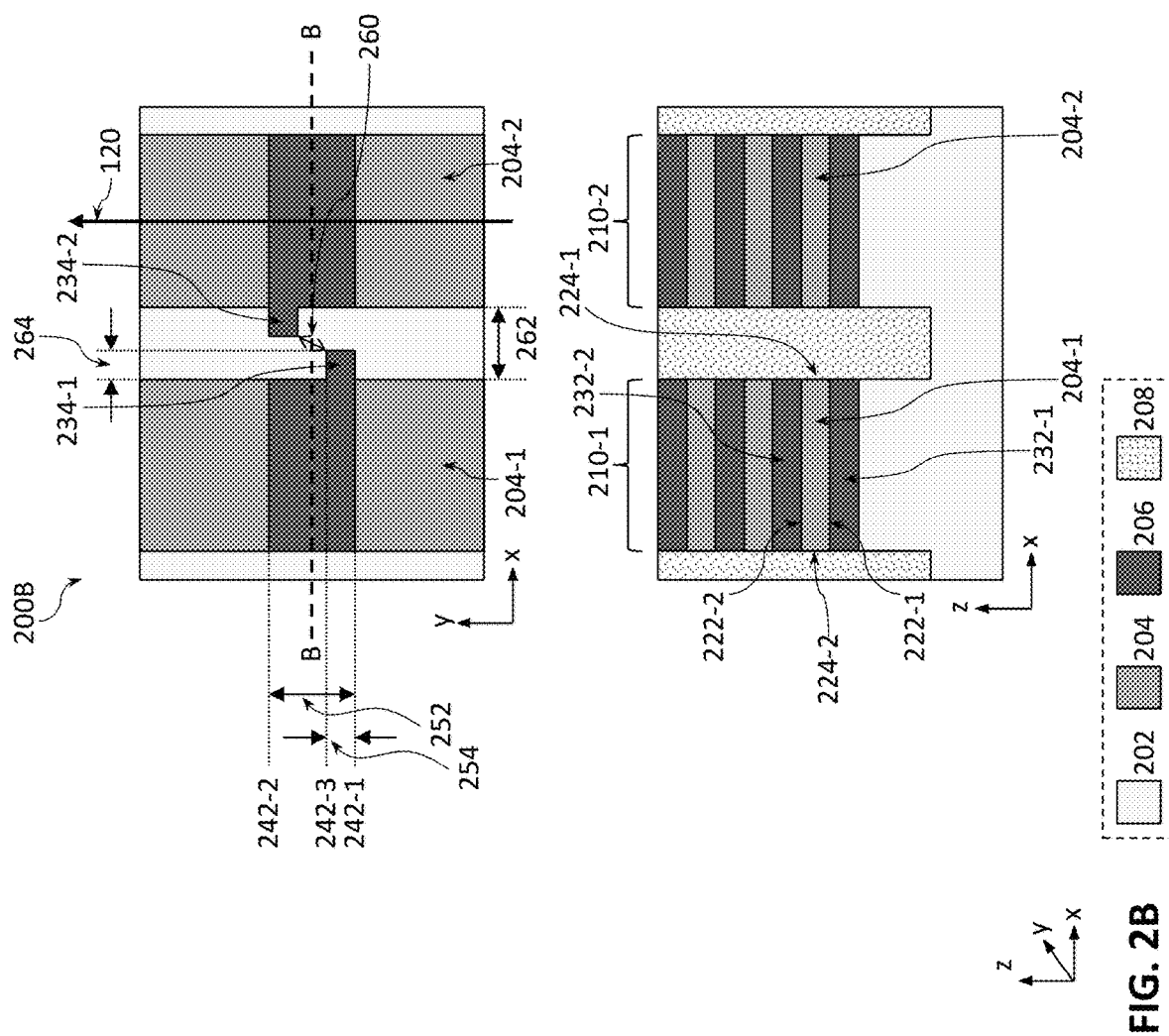
Figure 2C:
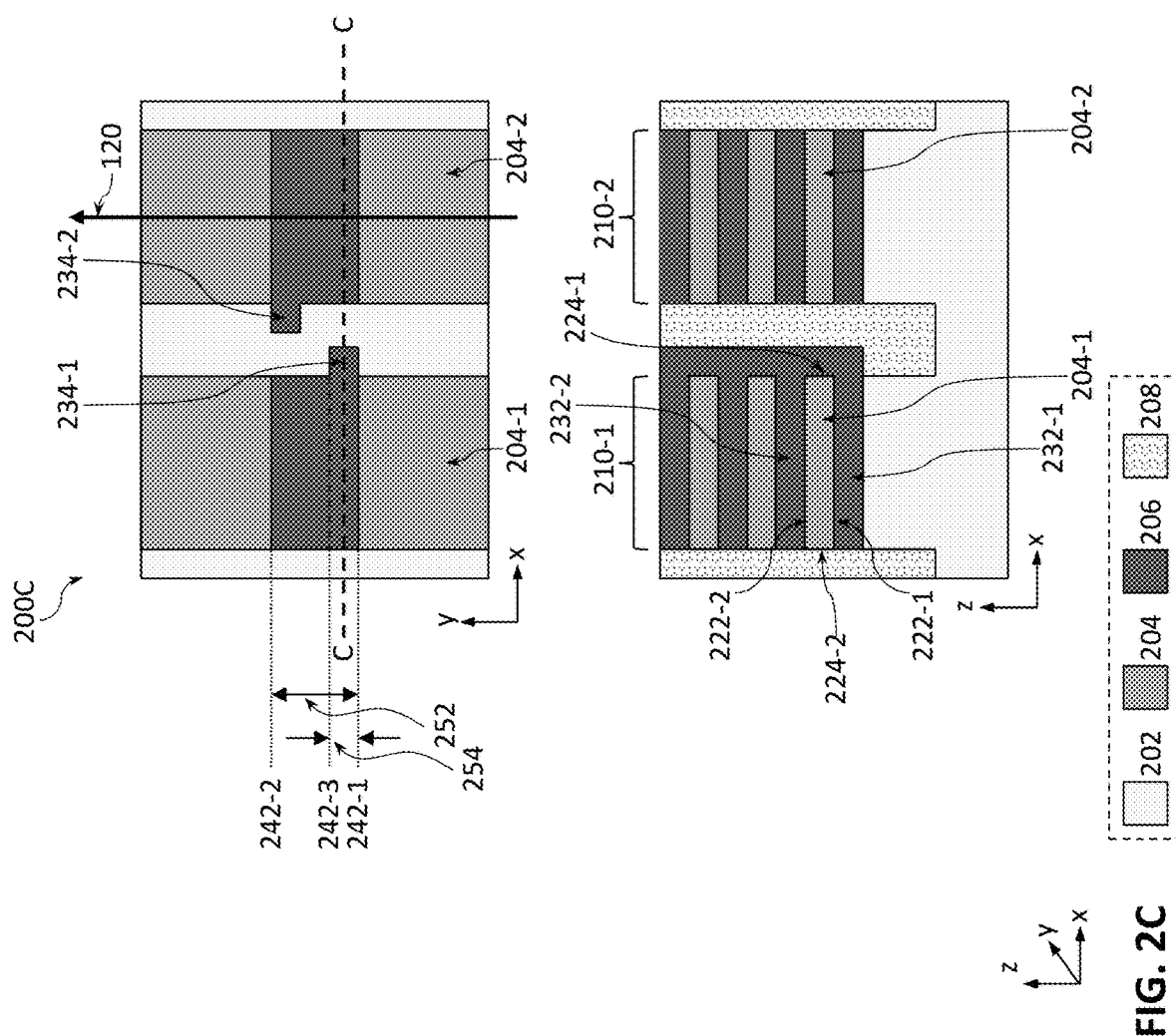

The nanoribbon 104 may take the form of a nanowire or nanoribbon, for example. In some embodiments, an area of a transversal cross-section of the nanoribbon 104 (i.e., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). In some embodiments, a width of the nanoribbon 104 (i.e., a dimension measured in a plane parallel to the support structure 102 and in a direction perpendicular to a long axis 120 of the nanoribbon 104, e.g., along the y-axis of the example coordinate system shown in FIG. 1) may be at least about 3 times larger than a height of the nanoribbon 104 (i.e., a dimension measured in a plane perpendicular to the support structure 102, e.g., along the z-axis of the example coordinate system shown in FIG. 1), including all values and ranges therein, e.g., at least about 4 times larger, or at least about 5 times larger. Although the nanoribbon 104 illustrated in FIG. 1 is shown as having a square cross-section, the nanoribbon 104 may instead have a cross-section that is rectangular but not square, a cross-section that is rounded at corners or otherwise irregularly shaped, and the gate stack 106 may conform to the shape of the nanoribbon 104. Furthermore, although FIG. 1, as well as FIGS. 2A-2C, depict embodiments in which the longitudinal axis 120 of the nanoribbon 104 runs substantially parallel to the plane of the support structure 102, this need not be the case; in other embodiments, the nanoribbon 104 may be oriented, e.g., "vertically" so as to be perpendicular to the support structure 102. For any orientation of the nanoribbon 104 with respect to the support structure 102, a "face" of a nanoribbon refers to the side of the nanoribbon that is larger than the side perpendicular to it (when measured in a plane substantially perpendicular to the long axis 120 of the nanoribbon 104), the latter side being referred to as a "sidewall" of a nanoribbon.

In some embodiments, the channel material of the nanoribbon 104 may be composed of semiconductor material systems including, for example, N-type or P-type materials systems. In some embodiments, the channel material of the nanoribbon 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material of the nanoribbon 104 may include a combination of semiconductor materials. In some embodiments, the channel material of the nanoribbon 104 may include a monocrystalline semiconductor, such as silicon (Si) or germanium (Ge). In some embodiments, the channel material of the nanoribbon 104 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 110 is an NMOS transistor), the channel material of the nanoribbon 104 may advantageously include a III-V material having a high electron mobility, such as, but not limited to InGaAs, InP, InSb, and InAs. For some such embodiments, the channel material of the nanoribbon 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material of the nanoribbon 104 may be an intrinsic III-V material, i.e., a III-V semiconductor material not intentionally doped with any electrically active impurity. In alternate embodiments, a nominal impurity dopant level may be present within the channel material of the nanoribbon 104, for example to further fine-tune a threshold voltage Vt, or to provide HALO pocket implants, etc. Even for impurity-doped embodiments however, impurity dopant level within the channel material of the nanoribbon 104 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 110 is a PMOS transistor), the channel material of the nanoribbon 104 may advantageously be a group IV material having a high hole mobility, such as, but not limited to Ge or a Ge-rich SiGe alloy. For some example embodiments, the channel material of the nanoribbon 104 may have a Ge content between 0.6 and 0.9, and advantageously may be at least 0.7. In some embodiments with highest mobility, the channel material of the nanoribbon 104 may be intrinsic III-V (or IV for P-type devices) material and not intentionally doped with any electrically active impurity. In alternate embodiments, one or more a nominal impurity dopant level may be present within the channel material of the nanoribbon 104, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the channel material of the nanoribbon 104 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor formed in the nanoribbon is a thin-film transistor (TFT), the channel material of the nanoribbon 104 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the nanoribbon 104 may have a thickness between about 5 and 75 nanometers, including all values and ranges therein. In some embodiments, a thin-film channel material may be deposited at relatively low temperatures, which allows depositing the channel material within the thermal budgets imposed on back end fabrication to avoid damaging other components, e.g., front end components such as the logic devices.

A gate stack 106 including a gate electrode material 108 and, optionally, a gate dielectric material 112, may wrap entirely or almost entirely around a portion of the nanoribbon 104 as shown in FIG. 1, with the active region (channel region) of the channel material of the transistor 110 corresponding to the portion of the nanoribbon 104 wrapped by the gate stack 106. The gate dielectric material 112 is not shown in the perspective drawing of the arrangement 100 shown in FIG. 1 (or in the example illustrations of FIGS. 2A-2C), but is shown in an inset 130 of FIG. 1, providing a cross-sectional side view of a portion of the nanoribbon 104 with a gate stack 106 wrapping around it. As shown in FIG. 1, the gate dielectric material 112 may wrap around a transversal portion of the nanoribbon 104 and the gate electrode material 108 may wrap around the gate dielectric material 112. In some embodiments, the gate stack 106 may fully encircle the nanoribbon 104. In other embodiments, the gate stack 106 may not be included on one or more sides of the nanoribbon 104, e.g., in some embodiments, the gate stack 106 may not be included on one of the sidewalls of the nanoribbon 104, e.g., in forksheet transistor implementations. Furthermore, although not specifically shown in FIG. 1, the gate stack 106 of the transistor 110 may be an asymmetric gate stack as described in greater detail with reference to FIGS. 2A-2C.

The gate electrode material 108 may include at least one P-type work function metal or N-type work function metal, depending on whether the transistor 110 is a P-type metal-oxide-semiconductor (PMOS) transistor or an N-type metal-oxide-semiconductor (NMOS) transistor (P-type work function metal used as the gate electrode material 108 when the transistor 110 is a PMOS transistor and N-type work function metal used as the gate electrode material 108 when the transistor 110 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric material 112 may include one or more high-k dielectrics including any of the materials discussed herein with reference to the insulator material that may surround portions of the transistor 110. In some embodiments, an annealing process may be carried out on the gate dielectric material 112 during manufacture of the transistor 110 to improve the quality of the gate dielectric material 112. The gate dielectric material 112 may have a thickness that may, in some embodiments, be between about 0.5 nanometers and 3 nanometers, including all values and ranges therein (e.g., between about 1 and 3 nanometers, or between about 1 and 2 nanometers). In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, e.g., when the transistor 110 is a storage transistor of a memory cell, the gate dielectric 112 may be replaced with, or complemented with a layer of a ferroelectric material. Such a ferroelectric material may include one or more materials which exhibit sufficient ferroelectric or antiferroelectric behavior even at thin dimensions. Some examples of such materials known at the moment include hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and yttrium-doped (Y-doped) hafnium oxide. However, in other embodiments, any other materials which exhibit ferroelectric or antiferroelectric behavior at thin dimensions may be used to replace, or to complement, the gate dielectric 112 when the transistor 110 is a storage transistor, and are within the scope of the present disclosure. The ferroelectric material included in the gate stack 106 when the transistor 110 is a storage transistor, may have a thickness that may, in some embodiments, be between about 0.5 nanometers and 10 nanometers, including all values and ranges therein (e.g., between about 1 and 8 nanometers, or between about 0.5 and 5 nanometers).

As further shown in FIG. 1, the nanoribbon 104 may include a source region and a drain region on either side of the gate stack 106, thus realizing a transistor. As is well known in the art, source and drain regions are formed for the gate stack of each MOS transistor. As described above, the source and drain regions of a transistor are interchangeable, and a nomenclature of a first S/D region and a second S/D region of an access transistor has been introduced for use in the present disclosure. In FIG. 1, reference numeral 114-1 is used to label the first S/D region, S/D1, and reference numeral 114-2 is used to label the second S/D region, S/D2, of the transistor 110.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (i.e., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

Example Nanoribbon Transistor Arrangement with Asymmetric Gate Enclosures

The nanoribbon 104 may form a basis for forming a non-planar transistor arrangement with one or more non-planar transistors with asymmetric gate enclosures. FIGS. 2A-2C illustrate one example of such a transistor arrangement, providing top-down and cross-sectional side views of an example nanoribbon transistor arrangement 200 with asymmetric gate enclosures, in accordance with various embodiments. Each of FIGS. 2A-2C provides a top-down view (i.e., a view in the x-y plane of the example coordinate system shown in FIGS. 1 and 2) and a cross-sectional side view (i.e., a view in the x-z plane of the example coordinate system shown in FIGS. 1 and 2) of the nanoribbon transistor arrangement 200. The cross-sectional side views of FIGS. 2A-2C illustrate cross-sections taken along different x-z planes of the arrangement 200. In particular, the cross-sectional side view shown in FIG. 2A is a cross-section taken along a plane AA shown with a dashed line in the top-down view shown in FIG. 2A (the plane AA being substantially perpendicular to the page of the drawing and including the dashed line shown in the top-down view of FIG. 2A), the cross-sectional side view shown in FIG. 2B is a cross-section taken along a plane BB shown with a dashed line in the top-down view shown in FIG. 2B (the plane BB being substantially perpendicular to the page of the drawing and including the dashed line shown in the top-down view of FIG. 2B), and the cross-sectional side view shown in FIG. 2C is a cross-section taken along a plane CC shown with a dashed line in the top-down view shown in FIG. 2C (the plane CC being substantially perpendicular to the page of the drawing and including the dashed line shown in the top-down view of FIG. 2C). The top-down views shown in FIGS. 2A-2C are the same, but are repeated in these drawings in order to show the planes AA, BB, and CC.

A number of elements referred to in the description of FIGS. 2A-2C with reference numerals are illustrated in these figures with different patterns, with a legend showing the correspondence between the reference numerals and patterns being provided at the bottom of each drawing page containing FIGS. 2A-2C. For example, the legend illustrates that FIGS. 2A-2C use different patterns to show a support structure 202, a nanoribbon 204, a gate stack 206, and an ILD material 208. Furthermore, although a certain number of a given element may be illustrated in some of FIGS. 2A-2C (e.g., two stacks of nanoribbons 204, with 3 nanoribbons in each stack), this is simply for ease of illustration, and more, or less, than that number may be included in other non-planar transistor arrangements with asymmetric gate enclosures according to various embodiments of the present disclosure. Still further, various views shown in FIGS. 2A-2C are intended to show relative arrangements of various elements therein, and that various non-planar transistor arrangements with asymmetric gate enclosures, or portions thereof, may include other elements or components that are not illustrated (e.g., transistor portions, various components that may be in electrical contact with any of the transistor portions, etc.). The top-down views shown in FIGS. 2A-2C may be seen as the top-down views in a cut of the arrangement 200 taken through a portion of the gate stack 206 between a nanoribbon 204-1 and a nanoribbon stacked above it, the top-down views not specifically showing the ILD material 208 in order to not obscure the view of the nanoribbons. In various embodiments, the ILD material 208 may include any of the high-k or low-k dielectric materials described with reference to the insulator material surrounding portions of the transistor 110 of FIG. 1.

As shown in FIGS. 2A-2C, the arrangement 200 illustrates an example of two stacks of nanoribbons provided next to one another, labeled as a nanoribbon stack 210-1 and a nanoribbon stack 210-2. Each stack 210 may include one or more nanoribbons 204, stacked above one another, e.g., as shown in FIGS. 2A-2C with 3 nanoribbons 204 shown in each stack 210. Each of the nanoribbons 204 may be implemented as the nanoribbon 104, described above. The nanoribbons 204 may be provided over a support structure 202, which may be implemented as the support structure 102, described above. Two stacks 210 are shown in FIGS. 2A-2C in order to illustrate how the pillar portions of the gate stacks of the adjacent transistors may be stacked with respect to one another in order to decrease the lateral distance between adjacent transistors (e.g., between a transistor implemented in a nanoribbon of the first stack 210-1 and a transistor implemented in a nanoribbon of the second stack 210-2), however, in further embodiments of the arrangement 200 only one of the stacks 210 may be included, or, in still further embodiments, more than two of the stacks 210 may be included adjacent to one another. Furthermore, although a plurality of nanoribbons 204 are shown in FIGS. 2A-2C in each of the stacks 210, in further embodiments of the arrangement 200, any of the stacks 210 may include one or more nanoribbons 204 (and different instances of the stack 210 implemented over a single support structure 202 may include different number of the nanoribbons 204).

For illustrative purposes, some descriptions are provided with respect to the nanoribbon 204-1 shown at the bottom (i.e., closest to the support structure 202) of the stack 210-1. However, these descriptions are applicable to other nanoribbons 204, possibly with minor revisions as would be apparent to a person of ordinary skill in the art based on the descriptions provided herein.

As shown in FIGS. 2A-2C, the arrangement 200 may include a first nanoribbon 204-1 and a second nanoribbon 204-2, provided adjacent to one another (i.e., provided proximate to one another). In some embodiments, the nanoribbon 204-1 may be one of a plurality of the nanoribbons 204 of the first stack 210-1 and/or the nanoribbon 204-2 may be one of a plurality of the nanoribbons 204 of the second stack 210-2. In some embodiments, each of the nanoribbons 204 may extend in a direction substantially parallel to the plane of the support structure 202. The long axis 120 is illustrated in FIGS. 2A-2C for the nanoribbon 204-2, and an axis parallel to the long axis 120 shown may be illustrated for the nanoribbon 204-1 as well (the axis for the nanoribbon 204-1 not specifically shown in FIGS. 2A-2C in order to not clutter the drawings). In some embodiments, the nanoribbons 204 of the first stack 210-1 may be formed of an N-type channel material, while the nanoribbons 204 of the second stack 210-2 may be formed of a P-type channel material, e.g., any of the N-type or P-type channel materials described with reference of the channel materials of the nanoribbon 104.

Turning to the details of the nanoribbon 204-1, as shown in FIGS. 2A-2C, the nanoribbon 204-1 may have a first (bottom) face 222-1, a second (top) face 222-2, a first sidewall 224-1, and a second sidewall 224-2. Since the nanoribbon 204-1 has a long axis 120 that extends substantially parallel to the support structure 202, the first and second faces 222 of the nanoribbon 204-1 may be substantially parallel to the support structure 202 (and opposite one another), while the first and second sidewalls 224 of the nanoribbon 204-1 may be substantially perpendicular to the support structure 202 (and also opposite one another).

A gate stack 206 may wrap around at least 3 sides of the nanoribbon 204-1, forming a gate of a nanoribbon transistor that may be formed on the basis of the nanoribbon 204-1. Although not specifically shown in FIGS. 2A-2C, S/D regions 114 may be provided in the nanoribbon 204-1, on either side of the gate stack 206, as was described with reference to FIG. 1. Furthermore, FIGS. 2A-2C do not specifically illustrate the details of the gate stack 206, but the gate stack 206 may include the gate electrode material 108, and, optionally, one or more of a gate dielectric material and a ferroelectric material, as described with reference to the material 112 shown in the inset 130 of FIG. 1.

Turning to the details of the gate stack 206 for the nanoribbon 204-1, in some embodiments, the gate stack 206 may have a first face portion 232-1, a second face portion 232-2, and a pillar portion 234-1 as shown in FIGS. 2A-2C. The first face portion 232-1 may be a portion of the gate stack 206 that is provided over (e.g., in contact with) at least a portion of a section of the first face 222-1 of the nanoribbon 204-1 between a first plane 242-1 and a second plane 242-2. Each of the planes 242 are shown in the top-down views of FIGS. 2A-2C as dotted lines illustrating respective planes that are substantially perpendicular to the plane of the support structure 202 and substantially perpendicular to the long axis of the nanoribbon 204-1 (i.e., each of the planes 242 shown in the top-down views of FIGS. 2A-2C illustrate planes substantially perpendicular to the plane of these drawings and including the dotted lines labeled with 242). Similarly, the second face portion 232-2 may be a portion of the gate stack 206 that is provided over (e.g., in contact with) at least a portion of a section of the second face 222-2 of the nanoribbon 204-1 between the first plane 242-1 and the second plane 242-2. The first and second face portions 232-1 and 232-2 of the gate stack 206 may be similar to the bottom and top gates of a double-gate transistor that may be formed on the basis of the nanoribbon 204-1. In some embodiments, any of the first and second face portions 232-1 and 232-2 of the gate stack 206 may extend in the direction of the x-axis of the coordinate system shown over the entire respective face of the nanoribbon 204-1. For example, as shown in FIGS. 2A-2C, any of the first and second face portions 232-1 and 232-2 of the gate stack 206 may extend between a first plane 244-1 and a second plane 244-2, which may be aligned with, respectively, the first sidewall 224-1 and the second sidewalls 224-2 of the nanoribbon 204-1, with a distance therebetween being a distance 256, labeled in the top-down views of FIGS. 2A-2C.

In contrast to a double-gate transistor, FIGS. 2A-2C further illustrate that the pillar portion 234-1 may be provided over (e.g., in contact with) at least a portion of (e.g., over all of) a section of the first sidewall 224-1 of the nanoribbon 204-1, and may connect the first face portion 232-1 and the second face portion 232-2 of the gate stack 206. If the pillar portion 234-1 was a portion of the gate stack 206 that extends between the first plane 242-1 and the second plane 242-2, then it would be similar to a forksheet transistor architecture. However, in contrast to a forksheet transistor architecture, the pillar portion 234-1 does not extend the entire length between the first and second planes 242-1 and 242-2, but it only provided between the first plane 242-1 and a third plane 242-3, where the third plane 242-3 is between the first plane 242-1 and the second plane 242-2, as can be seen in the top-down views of FIGS. 2A-2C.

As shown in the top-down views of FIGS. 2A-2C, a distance between the first plane 242-1 and the second plane 242-2 may be a distance 252, while a distance between the first plane 242-1 and the third plane 242-3 may be a distance 254. In some embodiments, the distance 254 may be less than about half of the distance 252, e.g., equal to or less than about 40% of the distance 252, or equal to or less than about one third of the distance 252. No portion of the gate stack 206 may be provided over the first sidewall 224-1 of the nanoribbon 204-1 between the third plane 242-3 and the second plane 242-2. Thus, the gate stack 206 forms an asymmetric gate enclosure in that there is a gate stack wrapping around only a portion of the sidewall 224-1 of the nanoribbon 204-1—namely, the portion between the first plane 242-1 and the third plane 242-3, but no portion of the gate stack 206 is provided over the sidewall 224-1 of the nanoribbon 204-1 between the third plane 242-3 and the second plane 242-2. That is why the pillar portion 234-1 is seen in the cross-sectional side view of FIG. 2C, because the plane CC is between the first plane 242-1 and the third plane 242-3, but not in the cross-sectional side views of FIG. 2A or FIG. 2B, because the planes AA and BB are between the third plane 242-3 and the second plane 242-2 where there is no gate stack 206 provided over the sidewall 224-1 of the nanoribbon 204-1. As shown in the cross-sectional side view of FIG. 2C, in some embodiments, the pillar portion 234-1 of the gate stack 206 may be continuous with the first face portion 232-1 and/or the second face portion 232-2 of the gate stack 206. In such embodiments, the continuity may be in terms of one or more of: the gate electrode material of these portions of the gate stack 206 being electrically continuous, the gate dielectric material of these portions of the gate stack 206 being continuous, and/or the ferroelectric material that may be included in these portions of the gate stack 206 being continuous. When more than a single nanoribbon 204 is included in a given stack 210, different portions of the gate stack 206 of different stacked nanoribbons 204 may be continuous with one another (e.g., as is shown in the cross-sectional side view of FIG. 2C).

Whether any portions of the gate stack 206 are provided over the second sidewall 224-2 of the nanoribbon 204-1 may be different in different embodiments. In some embodiments, there may be no portion of the gate stack 206 provided over the second sidewall 224-2 of the nanoribbon 204-1, as can be clearly seen in the top-down views of FIGS. 2A-2C. In such embodiments, the gate stack 206 may, thus, be provided on 3 sides of the nanoribbon 204-1—the first face 222-1, the second face 222-2, and the first sidewall 224-1 of the nanoribbon 204-1. However, in other embodiments, there may be a portion of gate stack 206 provided over the second sidewall 224-2 of the nanoribbon 204-1, either over the entire portion extending between the first and second planes 242-1 and 242-2, or only as a pillar portion similar to the pillar portion 234-1 (not specifically shown in FIGS. 2A-2C). In the latter embodiments, the pillar portion that may be provided over the second sidewall 224-2 of the nanoribbon 204-1 may, but does not have to be aligned with the pillar portion 234-1 provided over the first sidewall 224-1 and may have the same or different dimensions (e.g., a distance similar to the distance 254 for the pillar portion that may be provided over the second sidewall 224-2 of the nanoribbon 204-1 may be the same or different as the distance 254).

It should be noted that, while not specifically shown in FIGS. 2A-2C, in some embodiments, the first and second face portions 232-1, 232-2 of the gate stack 206 may be between a fourth plane 242-4 which is only shown in the top-down view of FIG. 2A and the second plane 242-2. In other words, in some embodiments, the pillar portion 234-1 may not be aligned with either edge of the face portions 232 of the gate stack 206 as it is shown in FIGS. 2A-2C to be aligned with the edge of the face portions 232.

In some embodiments, the gate stack 206 of the second nanoribbon 204-2 may be substantially similar to the gate stack 206 of the first nanoribbon 204-1. In particular, the gate stack 206 of the second nanoribbon 204-2 may include a pillar portion 234-2 (the other portions of this gate stack 206 are not described in detail because they would be similar to what has been described for the first nanoribbon 204-1). In some embodiments, the pillar portions 234-1 and 234-2 may be provided over the sidewalls of the nanoribbons 204-1 and 204-2 which are facing one another, as is shown in FIGS. 2A-2C, and may be offset, or staggered/stacked, with respect to one another. The top-down view of FIG. 2B illustrates a distance 260 that may be a distance between the closest edges of the pillar portions 234-1 and 234-2. In some embodiments, the distance 260 may be substantially equal to a distance that has been implemented between the gate stacks of the adjacent nanoribbons implemented in the forksheet architecture. Since now the distance 260 is measured diagonally and not along the x-axis of the example coordinate system shown in FIGS. 2A-2C, the distance between the first and second nanoribbons 204-1 and 204-2 may, therefore, advantageously be reduced, compared to the forksheet architecture. In some embodiments, the distance 260 may be between 5 and 50 nanometers, including all values and ranges therein, e.g., between about 5 and 30 nanometers, or between about 5 and 15 nanometers.

In some embodiments, the pillar portion 234 may extend away from the sidewall 224 of the nanoribbon by a distance 264, labeled in the top-down view of FIG. 2B for the gate stack 206 of the nanoribbon 204-1 (the same applies to the gate stack 206 of the nanoribbon 204-2). In some embodiments, the distance 264 may be between about 3 and 20 nanometers, including all values and ranges therein, e.g., between about 5 and 15 nanometers, or between about 5 and 10 nanometers. The pillar portions 234-1 and 234-2 are shown in FIGS. 2A-2C as not overlapping with one another with reference to the x-axis of the example coordinate system, i.e., a distance 262 between the first nanoribbon 204-1 and the second nanoribbon 204-2 (labeled in the top-down view of FIG. 2B) is greater than a sum of the distance 264 for the pillar portion 234-1 and an analogous distance for the pillar portion 234-2. However, in other embodiments (not specifically shown in FIGS. 2A-2C), the distance 262 may be smaller than the sum of the distance 264 for the pillar portion 234-1 and an analogous distance for the pillar portion 234-2. In some embodiments, the distance 262 may be between 5 and 100 nanometers, including all values and ranges therein, e.g., between about 20 and 50 nanometers, or between about 10 and 20 nanometers. In some embodiments, the distance 260 may be smaller than the distance 262. In some embodiments, the distance 260 may be substantially the same as, or greater (e.g., about 10% greater or about 50% greater) than the difference between the distance 262 and the distance 234-1.

The staggered arrangements of the pillar portions 234 of the adjacent nanoribbons 204 may not only reduce the distance between the adjacent nanoribbons 204, resulting in reduced cell area or, conversely, increased packing density, but may also reduce parasitic gate-to-contact and gate-to-S/D contact coupling capacitances. Reducing the parasitic capacitances may help conserve power at a given circuit speed or, conversely, increase speed for a given power consumption.

Example Fabrication Method

Figure 3:
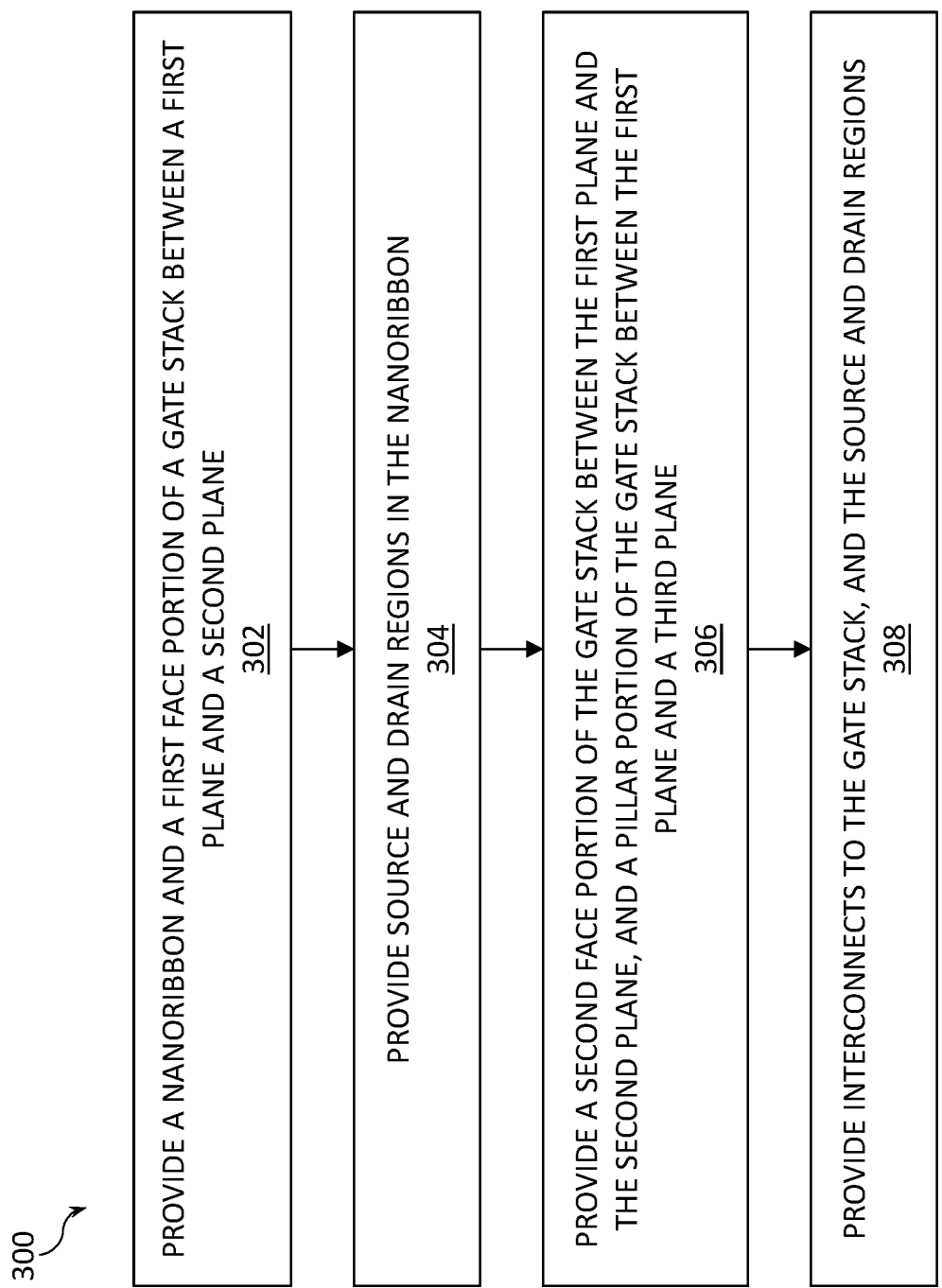
FIG. 3 is a flow diagram of an example method of manufacturing a non-planar transistor arrangement with an asymmetric gate enclosure, in accordance with various embodiments.

The non-planar transistor arrangements with asymmetric gate enclosures disclosed herein, e.g., any embodiments of the nanoribbon transistor arrangement 200, may be manufactured using any suitable techniques. For example, FIG. 3 is a flow diagram of an example method 300 of manufacturing a non-planar transistor arrangement with an asymmetric gate enclosure, in accordance with various embodiments. Although the operations of the method 300 are illustrated once each and in a particular order, the operations may be performed in any suitable order and repeated as desired. For example, one or more operations may be performed in parallel to manufacture multiple non-planar transistor arrangements with asymmetric gate enclosures substantially simultaneously. In another example, the operations may be performed in a different order to reflect the structure of an IC device in which the non-planar transistor arrangement with one or more asymmetric gate enclosures will be included.

In addition, the example manufacturing method 300 may include other operations not specifically shown in FIG. 3, such as various cleaning or planarization operations as known in the art. For example, in some embodiments, the support structure 102, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

At 302, a nanoribbon and a first face portion of a gate stack may be provided. The nanoribbon provided at 302 may take the form of any of the embodiments of the nanoribbon 204-1 disclosed herein (e.g., any of the embodiments discussed herein with reference to the nanoribbon transistor arrangement 200). The first face portion of the gate stack provided at 302 may take the form of any of the embodiments of the first face portion 232-1 of the gate stack 206 disclosed herein (e.g., any of the embodiments discussed herein with reference to the nanoribbon transistor arrangement 200). The nanoribbon and the first face portion of the gate stack may be provided at 302 using any suitable deposition and patterning technique known in the art.

At 304, a source region and a drain region may be provided in the nanoribbon provided at 302. The S/D regions provided at 304 may take the form of any of the embodiments of the S/D regions 114 disclosed herein (e.g., any of the embodiments discussed herein with reference to the nanoribbon transistor arrangements 100 or 200). The S/D regions may be provided at 304 using any suitable deposition and patterning technique known in the art.

At 306, a second face portion and a pillar portion of a gate stack may be provided. The second face portion of the gate stack 206 provided at 306 may take the form of any of the embodiments of the second face portion 232-2 of the gate stack 206 disclosed herein (e.g., any of the embodiments discussed herein with reference to the nanoribbon transistor arrangement 200). The pillar portion of the gate stack provided at 306 may take the form of any of the embodiments of the pillar portion 234-1 of the gate stack 206 disclosed herein (e.g., any of the embodiments discussed herein with reference to the nanoribbon transistor arrangement 200). The second face portion and the pillar portion of the gate stack may be provided at 306 using any suitable deposition and patterning technique known in the art.

At 308, interconnects to the gate stack, the source region, and the drain region may be provided. The interconnects to the gate stack, the source region, and the drain region provided at 308 may take the form of any of the embodiments of the interconnects to the gate stack 106/206 and the S/D regions 114 disclosed herein (e.g., any of the embodiments discussed herein with reference to the nanoribbon transistor arrangements 100 or 200). The interconnects to the gate stack, the source region, and the drain region may be provided at 308 using any suitable deposition and patterning technique known in the art.

Example Devices

Arrangements with one or more non-planar transistor arrangements with asymmetric gate enclosures as disclosed herein may be included in any suitable electronic device. FIGS. 4-7 illustrate various examples of devices and components that may include one or more non-planar transistor arrangements with asymmetric gate enclosures as disclosed herein.

FIGS. 4A-4B are top views of a wafer 2000 and dies 2002 that may include one or more non-planar transistor arrangements with asymmetric gate enclosures in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 5. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more non-planar transistor arrangements with asymmetric gate enclosures as described herein). After the fabrication of the semiconductor product is complete (e.g., after manufacture of one or more layers of the nanoribbon transistors with asymmetric gate enclosures as described herein, e.g., after manufacture of any embodiment of the non-planar transistor arrangements with asymmetric gate enclosures described with reference to FIGS. 1-3), the wafer 2000 may undergo a singulation process in which each of the dies 2002 is separated from one another to provide discrete "chips" of the semiconductor product. In particular, devices that include one or more non-planar transistor arrangements with asymmetric gate enclosures as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 7) or other logic that is configured to store information in the memory devices or execute instructions stored in the memory array.

Figure 5:
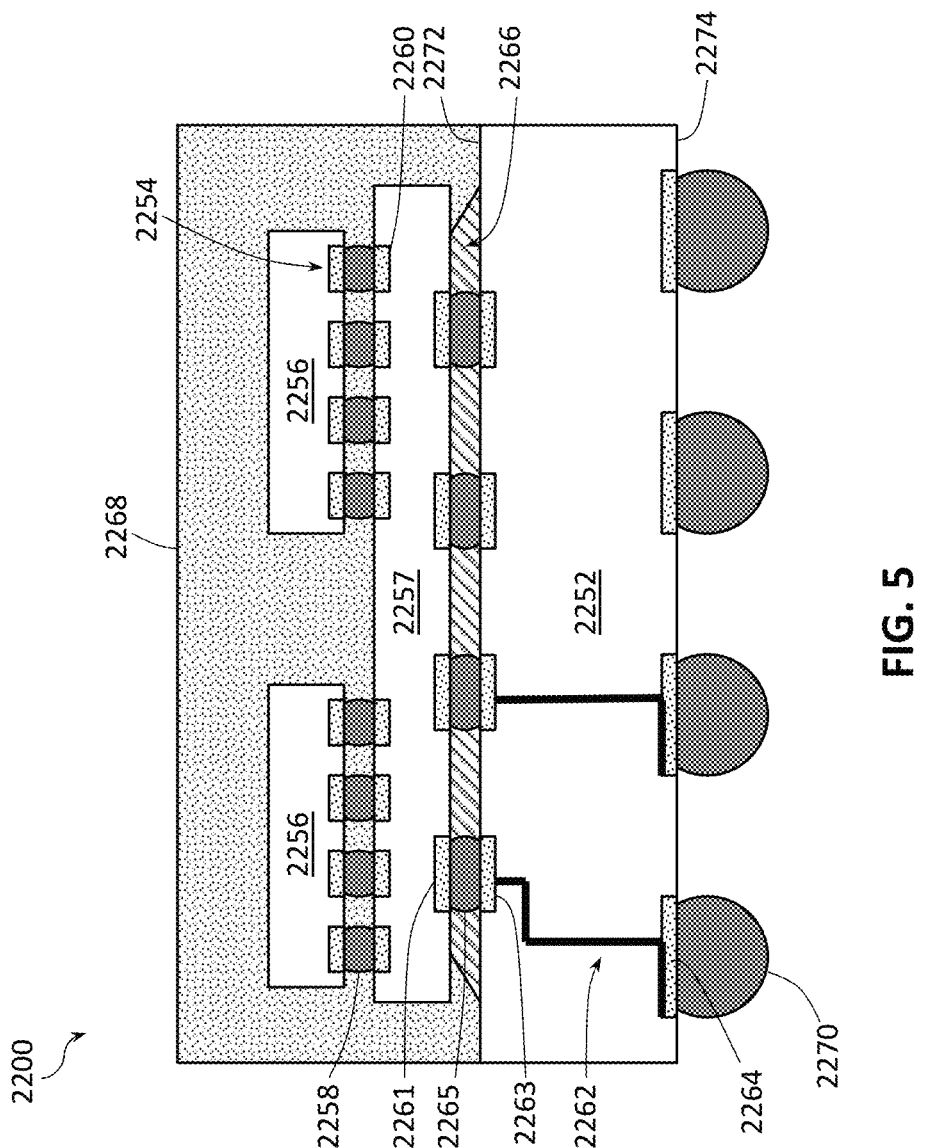
FIG. 5 is a cross-sectional side view of an IC package that may include one or more non-planar transistor arrangements with asymmetric gate enclosures, in accordance with various embodiments.

FIG. 5 is a side, cross-sectional view of an example IC package 2200 that may include one or more non-planar transistor arrangements with asymmetric gate enclosures in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 5 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 5 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 5 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 6.

The dies 2256 may take the form of any of the embodiments of the die 2002 discussed herein (e.g., may include any of the embodiments of the non-planar transistor arrangements with asymmetric gate enclosures as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more non-planar transistor arrangements with asymmetric gate enclosures, e.g., as discussed above; in some embodiments, at least some of the dies 2256 may not include any non-planar transistor arrangements with asymmetric gate enclosures.

The IC package 2200 illustrated in FIG. 5 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 5, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 6:
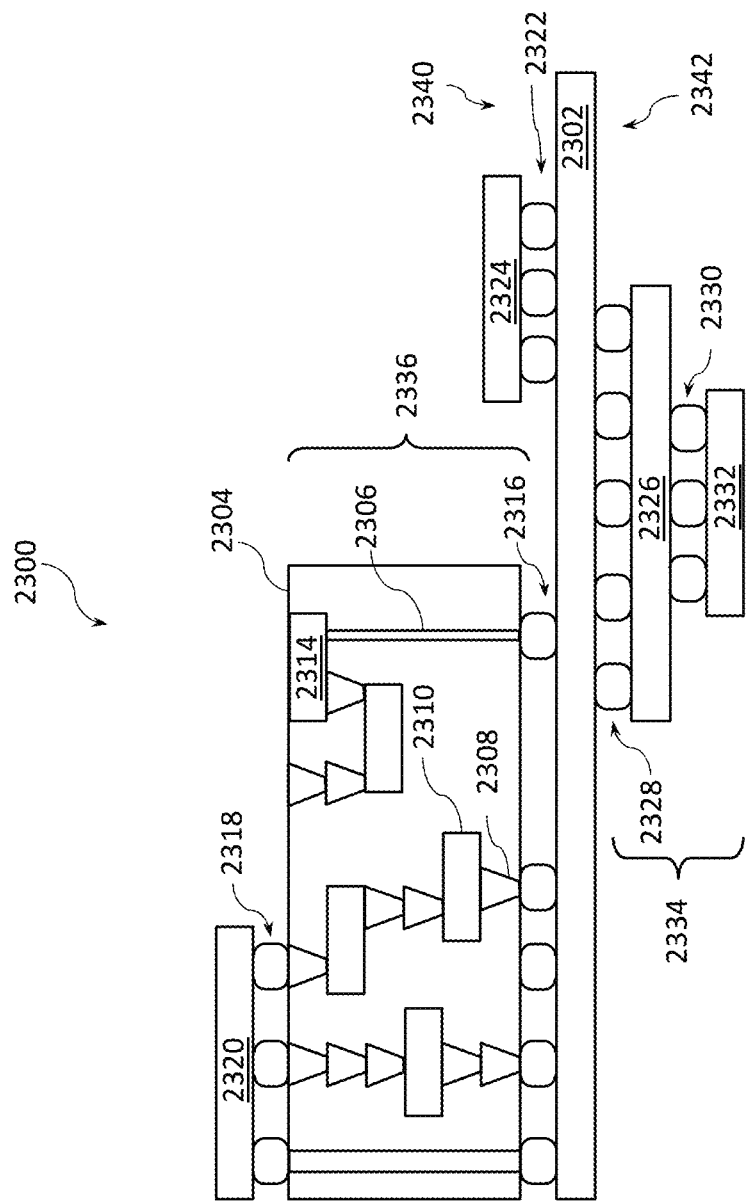
FIG. 6 is a cross-sectional side view of an IC device assembly that may include one or more non-planar transistor arrangements with asymmetric gate enclosures, in accordance with various embodiments.

FIG. 6 is a cross-sectional side view of an IC device assembly 2300 that may include components having one or more non-planar transistor arrangements with asymmetric gate enclosures in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more non-planar transistor arrangements with asymmetric gate enclosures in accordance with any of the embodiments disclosed herein; e.g., any of the IC packages discussed below with reference to the IC device assembly 2300 may take the form of any of the embodiments of the IC package 2200 discussed above with reference to FIG. 5 (e.g., may include one or more non-planar transistor arrangements with asymmetric gate enclosures provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 6 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 6), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 4B), an IC device, or any other suitable component. In particular, the IC package 2320 may include one or more non-planar transistor arrangements with asymmetric gate enclosures as described herein. Although a single IC package 2320 is shown in FIG. 6, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 6, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 6 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 7:
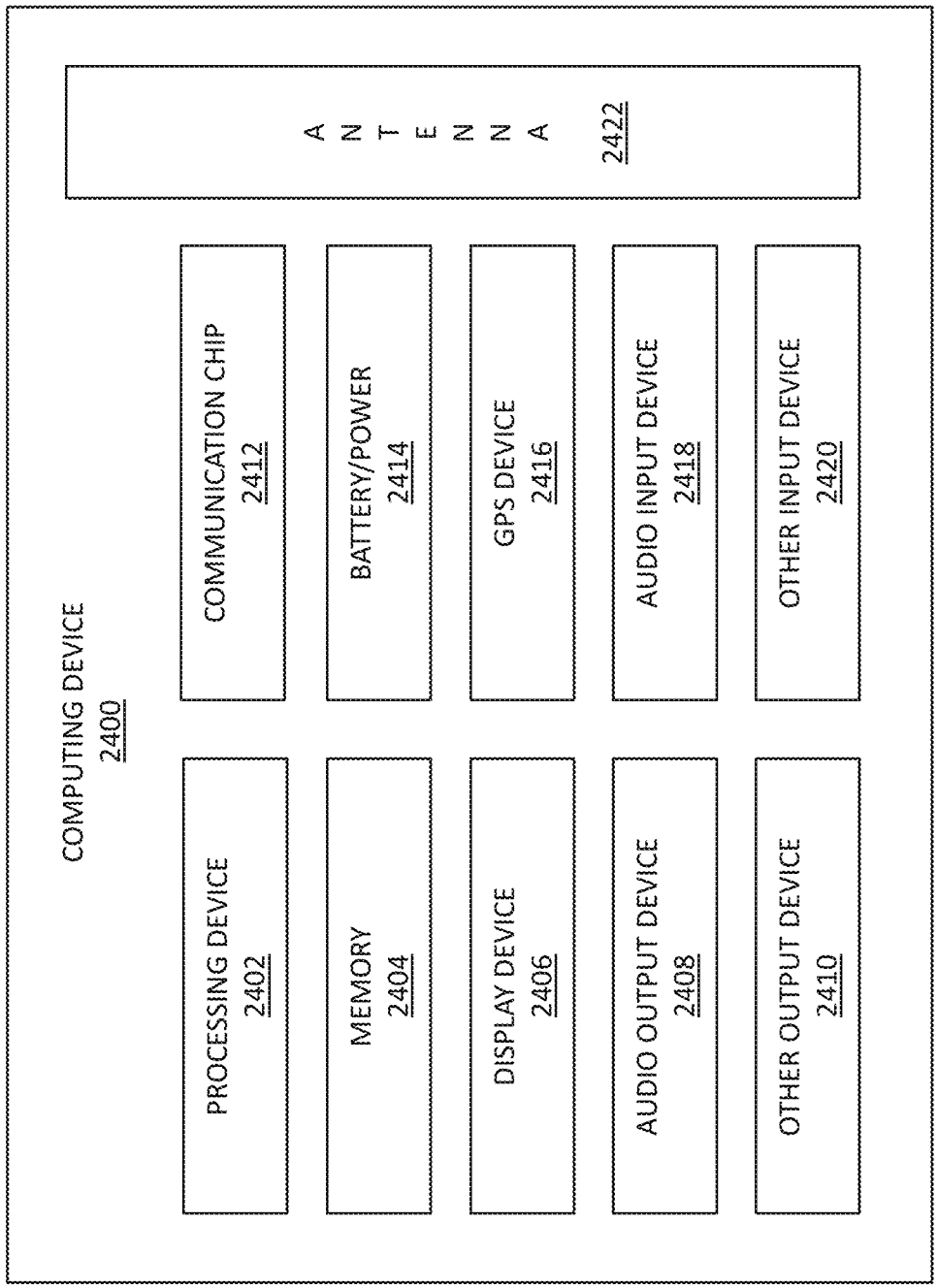
FIG. 7 is a block diagram of an example computing device that may include one or more non-planar transistor arrangements with asymmetric gate enclosures, in accordance with various embodiments.

FIG. 7 is a block diagram of an example computing device 2400 that may include one or more components with one or more non-planar transistor arrangements with asymmetric gate enclosures in accordance with any of the embodiments disclosed herein. For example, any suitable ones of the components of the computing device 2400 may include a die (e.g., the die 2002, shown in FIG. 4B) including one or more non-planar transistor arrangements with asymmetric gate enclosures in accordance with any of the embodiments disclosed herein. Any of the components of the computing device 2400 may include an IC package 2200 (e.g., as shown in FIG. 5). Any of the components of the computing device 2400 may include an IC device assembly 2300 (e.g., as shown in FIG. 6).

A number of components are illustrated in FIG. 7 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 7, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

In the following examples, the terms "first face portion" and "second face portion" to differentiate between the portions of a gate stack on, respectively, the first face and the second face of a nanoribbon.

Example 1 provides a transistor arrangement that includes a support structure (e.g., 202, described herein, e.g., a substrate, a chip, or a wafer) and a channel material (e.g., 204, described herein, e.g., a semiconductor channel material). The channel material is shaped as a nanoribbon having a first face (e.g., 222-1, described herein) opposite (i.e., parallel to) the support structure, a second face (e.g., 222-2, described herein) opposite the first face, a first sidewall (e.g., 224-1, described herein) substantially perpendicular to the support structure, and a second sidewall (e.g., 224-2, described herein) opposite the first sidewall. In such a transistor arrangement the nanoribbon extends in a direction substantially parallel to the support structure. In this context, the term "nanoribbon" refers to an elongated structure such as a nanoribbon or a nanowire, having a long axis parallel to the support structure. The transistor arrangement further includes a gate stack provided over a portion of the nanoribbon. The gate stack includes a first face portion (e.g., 232-1, described herein) provided over (e.g., in contact with) at least a portion of (e.g., over all of) a section of the first face of the nanoribbon between a first plane (e.g., 242-1, described herein) substantially perpendicular to the support structure and to a long axis of the nanoribbon and a second plane (e.g., 242-2, described herein) substantially perpendicular to the support structure and to the long axis of the nanoribbon, the second plane being at a distance 252 from the first plane. The gate stack further includes a second face portion (e.g., 232-2, described herein) provided over (e.g., in contact with) at least a portion of (e.g., over all of) a section of the second face of the nanoribbon between the first plane (e.g., 242-1, described herein) and the second plane (e.g., 242-2, described herein). The gate stack also includes a pillar portion (e.g., 234-1, described herein) provided over (e.g., in contact with) at least a portion of (e.g., over all of) a section of the first sidewall of the nanoribbon between the first plane (e.g., 242-1, described herein) and a third plane (e.g., 242-3, described herein) substantially perpendicular to the support structure and to the long axis of the nanoribbon, the third plane being between the first plane and the second plane, e.g., the third plane being at a distance 254 from the first plane. In such a transistor arrangement, no portion of the gate stack is provided over a section of the first sidewall of the nanoribbon between the third plane (e.g., 242-3, described herein) and the second plane (e.g., 242-2, described herein).

Example 2 provides the transistor arrangement according to example 1, where no portion of the gate stack is provided over a section of the second sidewall of the nanoribbon between the first plane (e.g., 242-1, described herein) and the second plane (e.g., 242-2, described herein).

Example 3 provides the transistor arrangement according to examples 1 or 2, where a distance between the first plane and the third plane is less than a half of a distance between the first plane and the second plane, including all values and ranges therein, e.g., less than about 0.4 or less than about 0.33 of the distance between the first plane and the second plane.

Example 4 provides the transistor arrangement according to any one of the preceding examples, where the portion of (e.g., over all of) the section of the first face of the nanoribbon between the first plane (e.g., 242-1, described herein) and the second plane (e.g., 242-2, described herein) over which the first face portion (e.g., 232-1, described herein) of the gate stack is provided between a first sidewall plane (e.g., 244-1, described herein) substantially perpendicular to the support structure and substantially parallel to the long axis of the nanoribbon and a second sidewall plane (e.g., 244-2, described herein) substantially perpendicular to the support structure and substantially parallel to the long axis of the nanoribbon, the second sidewall plane being at a distance 256 from the first sidewall plane.

Example 5 provides the transistor arrangement according to example 4, where the portion of (e.g., over all of) the section of the second face of the nanoribbon between the first plane and the second plane over which the second face portion of the gate stack is provided between the first sidewall plane and the second sidewall plane.

Example 6 provides the transistor arrangement according to any one of the preceding examples, where the gate stack includes a gate electrode material.

Example 7 provides the transistor arrangement according to example 6, where the gate electrode material of the pillar portion of the gate stack is continuous with the gate electrode material of the first face portion of the gate stack.

Example 8 provides the transistor arrangement according to examples 6 or 7, where the gate electrode material of the pillar portion of the gate stack is continuous with the gate electrode material of the second face portion of the gate stack.

Example 9 provides the transistor arrangement according to any one of examples 6-8, where the gate stack further includes a gate dielectric material, and the gate dielectric material is between the gate electrode material and the channel material.

Example 10 provides the transistor arrangement according to any one of examples 6-9, where the gate stack further includes a ferroelectric material, and the ferroelectric material is between the gate electrode material and the channel material.

Example 11 provides the transistor arrangement according to example 10, where the ferroelectric material includes one or more of a material including hafnium, zirconium, and oxygen (e.g., hafnium zirconium oxide), a material including silicon, hafnium, and oxygen (e.g., silicon-doped hafnium oxide), a material including germanium, hafnium, and oxygen (e.g., germanium-doped hafnium oxide), a material including aluminum, hafnium, and oxygen (e.g., aluminum-doped hafnium oxide), and a material including yttrium, hafnium, and oxygen (e.g., yttrium-doped hafnium oxide).

Example 12 provides the transistor arrangement according to any one of examples 6-8, where the gate electrode material is in contact with the channel material.

Example 13 provides a transistor arrangement that includes a structure of a channel material, the structure having a top face and a sidewall; a transistor having a gate stack, where the gate stack includes a face portion over the top face of the structure, and a pillar portion over the sidewall of the structure, where, when measured in a direction of a line between a source region and a drain region of the transistor (both provided in the structure of the channel material, on either side of the gate stack), a dimension of the pillar portion is smaller than a dimension of the face portion.

Example 14 provides the transistor arrangement according to example 13, where the dimension of the pillar portion is more than 2 times smaller than the dimension of the face portion.

Example 15 provides the transistor arrangement according to examples 13 or 14, where a gate electrode material of the face portion is electrically continuous with a gate electrode material of the pillar portion.

Example 16 provides the transistor arrangement according to any one of examples 13-15, where the structure is a first structure (e.g., the nanoribbon 204-1), the channel material is a first channel material, the gate stack is a first gate stack, the face portion is a first face portion, the pillar portion is a first pillar portion (e.g., the pillar portion 234-1), the transistor arrangement further includes a second structure (e.g., the nanoribbon 204-2) of a second channel material, the second structure having a top face and a sidewall, the transistor arrangement further includes a second transistor having a second gate stack, the second gate stack including a second face portion over the top face of the second structure, and a second pillar portion (e.g., the pillar portion 234-2) over the sidewall of the second structure. In such a transistor arrangement, when measured in a direction of a line between a source region and a drain region of the second transistor (both provided in the second structure of the second channel material, on either side of the second gate stack), a dimension of the second pillar portion is smaller than a dimension of the second face portion. Furthermore, a distance between two closest points of the first pillar portion and the second pillar portion (e.g., the distance 260) is equal to or greater than a distance between the first pillar portion and the second structure (e.g., a difference between the distance 262 and the distance 264).

Example 17 provides the transistor arrangement according to example 16, where the distance between two closest points of the first pillar portion and the second pillar portion is smaller than a distance between the first structure and the second structure (e.g., the distance 262).

Example 18 provides the transistor arrangement according to examples 16 or 17, where a portion of the first pillar portion is opposite a portion of the second face portion, and/or a portion of the second pillar portion is opposite a portion of the first face portion.

Example 19 provides a method for fabricating a transistor arrangement. The method includes providing a first structure of a first channel material; providing a second structure of a second channel material, each of the first and second structures having a top face and a sidewall; and providing a first transistor that includes a first gate stack, where the first gate stack includes a first face portion over the top face of the first structure, and a first pillar portion over the sidewall of the first structure. The method further includes providing a second transistor that includes a second gate stack, where the second gate stack includes a second face portion over the top face of the second structure, and a second pillar portion over the sidewall of the second structure. In such a method, when measured in a direction of a line between a source region and a drain region of the first transistor, a dimension of the first pillar portion is smaller than a dimension of the first face portion, and, when measured in a direction of a line between a source region and a drain region of the second transistor, a dimension of the second pillar portion is smaller than a dimension of the second face portion.

Example 20 provides the method according to example 19, where the distance between two closest points of the first pillar portion and the second pillar portion is smaller than a distance between the first structure and the second structure (e.g., the distance 262).

Example 21 provides an IC package that includes an IC die and a further IC component, coupled to the IC die. The IC die includes one or more transistor arrangements according to any one of the preceding examples (e.g., each transistor arrangement may be a transistor arrangement according to any one of examples 1-18 and/or may be formed according to a method of any one of examples 19-20).

Example 22 provides the IC package according to example 21, where the further component is one of a package substrate, a flexible substrate, or an interposer.

Example 23 provides the IC package according to examples 21 or 22, where the further component is coupled to the IC die via one or more first level interconnects.

Example 24 provides the IC package according to example 23, where the one or more first level interconnects include one or more solder bumps, solder posts, or bond wires.

Example 25 provides a computing device that includes a circuit board; and an IC die coupled to the circuit board, where the IC die includes one or more of: one or more transistor arrangements according to any one of the preceding examples (e.g., each transistor arrangement may be a transistor arrangement according to any one of examples 1-18 and/or may be formed according to a method of any one of examples 19-20), and the IC package according to any one of the preceding examples (e.g., the IC package according to any one of examples 21-24).

Example 26 provides the computing device according to example 25, where the computing device is a wearable computing device (e.g., a smart watch) or handheld computing device (e.g., a mobile phone).

Example 27 provides the computing device according to examples 25 or 26, where the computing device is a server processor.

Example 28 provides the computing device according to examples 25 or 26, where the computing device is a motherboard.

Example 29 provides the computing device according to any one of examples 25-28, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A transistor arrangement, comprising:
   a channel material having a first face, a second face opposite the first face, a first sidewall substantially perpendicular to the first face, and a second sidewall opposite the first sidewall; and
   a gate electrode material over a portion of the channel material, the gate electrode material comprising:
      a first portion over at least a portion of a section of the first face between a first plane substantially perpendicular to the first face and to a long axis of the channel material and a second plane substantially perpendicular to the first face and to the long axis of the channel material,
      a second portion over at least a portion of a section of the second face between the first plane and the second plane, and
      a third portion over at least a portion of a section of the first sidewall between the first plane and a third plane substantially perpendicular to the first face and to the long axis of the channel material,
      where no portion of the gate electrode material is over a section of the first sidewall between the third plane and the second plane.

2. The transistor arrangement according to claim 1, wherein no portion of the gate electrode material is over a section of the second sidewall between the first plane and the second plane.

3. The transistor arrangement according to claim 1, wherein a distance between the first plane and the third plane is less than a half of a distance between the first plane and the second plane.

4. The transistor arrangement according to claim 1, wherein the portion of the section of the first face between the first plane and the second plane is between a first sidewall plane substantially perpendicular to the first face and substantially parallel to the long axis of the channel material and a second sidewall plane substantially perpendicular to the first face and substantially parallel to the long axis of the channel material.

5. The transistor arrangement according to claim 4, wherein the portion of the section of the second face between the first plane and the second plane is between the first sidewall plane and the second sidewall plane.

6. The transistor arrangement according to claim 1, wherein the gate electrode material of the third portion is continuous with the gate electrode material of the first portion.

7. The transistor arrangement according to claim 1, wherein the gate electrode material of the third portion is continuous with the gate electrode material of the second portion.

8. The transistor arrangement according to claim 1, further comprising a gate dielectric material between the gate electrode material and the channel material.

9. The transistor arrangement according to claim 1, further comprising a ferroelectric material between the gate electrode material and the channel material.

10. The transistor arrangement according to claim 9, wherein the ferroelectric material includes one or more of:
    a material including hafnium, zirconium, and oxygen,
    a material including silicon, hafnium, and oxygen,
    a material including germanium, hafnium, and oxygen,
    a material including aluminum, hafnium, and oxygen, and
    a material including yttrium, hafnium, and oxygen.

11. The transistor arrangement according to claim 1, wherein the gate electrode material is in contact with the channel material.

12. An integrated circuit (IC) structure, comprising:
    a structure of a channel material, the structure having a top face and a sidewall; and
    a transistor having a gate stack, the gate stack comprising:
       a face portion over the top face of the structure, and
       a pillar portion over the sidewall of the structure,
    wherein, when measured in a direction of a line between a source region and a drain region of the transistor, a dimension of the pillar portion is smaller than a dimension of the face portion, and wherein the pillar portion is a portion of the gate stack that extends further away from the sidewall than the face portion.

13. The IC structure according to claim 12, wherein the dimension of the pillar portion is more than 2 times smaller than the dimension of the face portion.

14. The IC structure according to claim 12, wherein a gate electrode material of the face portion is electrically continuous with a gate electrode material of the pillar portion.

15. The IC structure according to claim 12, wherein:
    the structure is a first structure,
    the channel material is a first channel material,
    the gate stack is a first gate stack,
    the face portion is a first face portion,
    the pillar portion is a first pillar portion,
    the IC structure further includes a second structure of a second channel material, the second structure having a top face and a sidewall,
    the IC structure further includes a second transistor having a second gate stack, the second gate stack comprising a second face portion over the top face of the second structure, and a second pillar portion over the sidewall of the second structure,
    when measured in a direction of a line between a source region and a drain region of the second transistor, a dimension of the second pillar portion is smaller than a dimension of the second face portion, and a distance between two closest points of the first pillar portion and the second pillar portion is equal to or greater than a distance between the first pillar portion and the second structure.

16. The IC structure according to claim 15, wherein the distance between two closest points of the first pillar portion and the second pillar portion is smaller than a distance between the first structure and the second structure.

17. The IC structure according to claim 15, wherein:
a portion of the first pillar portion is opposite a portion of the second face portion, or
a portion of the second pillar portion is opposite a portion of the first face portion.

18. A method for fabricating a transistor arrangement, the method comprising:
providing a first structure of a first channel material;
providing a second structure of a second channel material, each of the first and second structures having a top face and a sidewall;
providing a first transistor that includes a first gate electrode material, the first gate electrode material comprising:
a first face portion over the top face of the first structure, and
a second portion over the sidewall of the first structure; and
providing a second transistor that includes a second gate electrode material, the second gate electrode material comprising:
a first portion over the top face of the second structure, and
a second portion over the sidewall of the second structure,
wherein:
when measured in a direction of a line between a source region and a drain region of the first transistor, a dimension of the second portion of the first gate electrode material is smaller than a dimension of the first portion of the first gate electrode material,
when measured in a direction of a line between a source region and a drain region of the second transistor, a dimension of the second portion of the second gate electrode material is smaller than a dimension of the first portion of the second gate electrode material, and
a distance between two closest points of the second portion of the first gate electrode material and the second portion of the second gate electrode material is smaller than a distance between the first structure and the second structure.

19. The IC structure according to claim 12, wherein the pillar portion is a portion of the gate stack that extends further away from the sidewall than all other portions of the gate stack.

20. The method according to claim 18, wherein the gate electrode material of the second portion is continuous with the gate electrode material of the first portion.

* * * * *

UNITED STATES PATENT AND TRADEMARK OFFICE
CERTIFICATE OF CORRECTION

| | |
|---|---|
| PATENT NO. | : 11,984,487 B2 |
| APPLICATION NO. | : 16/892447 |
| DATED | : May 14, 2024 |
| INVENTOR(S) | : Sean T. Ma et al. |

It is certified that error appears in the above-identified patent and that said Letters Patent is hereby corrected as shown below:

On the Title Page

Under "Primary Examiner", in Column 2, Line 1, delete "William F Kraig" and insert -- Earl N Taylor --, therefor.

In the Claims

In Column 29, Claim 18, Line 23, delete "first face" and insert -- first --, therefor.

Signed and Sealed this
Sixteenth Day of July, 2024

*Katherine Kelly Vidal*
Katherine Kelly Vidal
*Director of the United States Patent and Trademark Office*